US006876593B2

(12) United States Patent
Shi et al.

(10) Patent No.: US 6,876,593 B2
(45) Date of Patent: Apr. 5, 2005

(54) METHOD AND APPARATUS FOR PARTIAL REFRESHING OF DRAMS

(75) Inventors: Jun Shi, San Jose, CA (US); Animesh Mishra, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 15 days.

(21) Appl. No.: 10/612,585

(22) Filed: Jul. 1, 2003

(65) Prior Publication Data

US 2005/0002253 A1 Jan. 6, 2005

(51) Int. Cl.[7] .................................................. G11C 7/00

(52) U.S. Cl. ....................................... 365/222; 365/228

(58) Field of Search ................................ 365/222, 227, 365/228

(56) References Cited

U.S. PATENT DOCUMENTS 6,028,805 A * 2/2000 Higuchi ...................... 365/222
6,490,216 B1 * 12/2002 Chen et al. ................. 365/222

* cited by examiner

*Primary Examiner*—Anh Phung
(74) *Attorney, Agent, or Firm*—Benjamin D. Burge

(57) ABSTRACT

Memory devices, refresh logic and approaches to selectively refresh each row of memory cells within a memory device depending on whether or not each is marked as having data to be preserved.

11 Claims, 7 Drawing Sheets

687
688
689
CK, -CK
command
activate
BA0, BA1
bank sel
A0-A11
row addr 687
688
689
CK, -CK
command
read/write
BA0, BA1
bank sel
A0 up to A9
col addr
A10
auto pre
A11
auto mark

METHOD AND APPARATUS FOR PARTIAL REFRESHING OF DRAMS

BACKGROUND

Computer systems continue to be designed to meet the two often opposing goals of increased speed and decreased power consumption. The struggle to meet both goals becomes quite evident in the case of electronic devices such as portable computer systems, including notebook and hand-held computers. As ever more uses for such electronic devices are found, there is a need for ever more processing capability, including faster processors, more memory, etc. However, at the same time, as ever more uses for such devices are found, there is an increasing desire to make them ever more portable so that such devices become easier to transport to places where they can be used in such new found ways.

This struggle has resulted in efforts to find ways to decrease the amount of power required by each of the components of such electronic devices, including memory devices. Known approaches include creating reduced power modes (commonly referred to as "sleep modes" or "hibernation modes") for such electronic devices to enter into when not actively being used. DRAM (dynamic random access memory) devices have been created with lower power modes, including what is commonly referred to in the DRAM device industry as "self refresh" mode. In self refresh mode, interactions between DRAM devices and other components are minimized, including interactions where commands are regularly transmitted to DRAM devices to perform the function of refreshing memory cells within a DRAM device to prevent loss of data stored within those memory cells. Self refresh modes entail using a minimal amount of logic built into a DRAM device to allow the DRAM device to autonomously carry out the function of refreshing the DRAM device's memory cells.

However, such approaches to reducing DRAM device power consumption have not addressed the problem of the unnecessary wasting of power to refresh large quantities of memory cells not containing data to be preserved, even in reduced power modes such as self refresh mode.

BRIEF DESCRIPTION OF THE DRAWINGS

The objects, features, and advantages of the present invention will be apparent to one skilled in the art in view of the following detailed description in which.

DETAILED DESCRIPTION

In the following description, for purposes of explanation, numerous details are set forth in order to provide a thorough understanding of embodiments of the present invention. However, it will be apparent to one skilled in the art that these specific details are not required in order to practice the present invention as hereinafter claimed.

Embodiments of the present invention concern incorporating support for limiting the refreshing of memory cells of a DRAM device to only portions of a DRAM device having memory cells containing data to be preserved, and thereby reduce the amount of power used to refresh memory cells not containing such data. Although the following discussion centers on DRAM devices, it will be understood by those skilled in the art that the present invention as hereinafter claimed may be practiced in support of any type of memory device having cells in need of being refreshed or otherwise maintained at regular intervals in order to preserve their contents. It will also be understood by those skilled in the art that although the following discussion centers on memory devices in which memory cells are organized in two dimensional arrays of rows and columns, the memory cells may be organized in any of a number of ways, including into banks and with or without interleaving, arrays of more than two dimensions, content-addressable, etc. Also, although at least part of the following discussion centers on memory within computer systems, it will be understood by those skilled in the art that the present invention as hereinafter claimed may be practiced in connection with other electronic devices or systems having memory devices.

Figure 1:
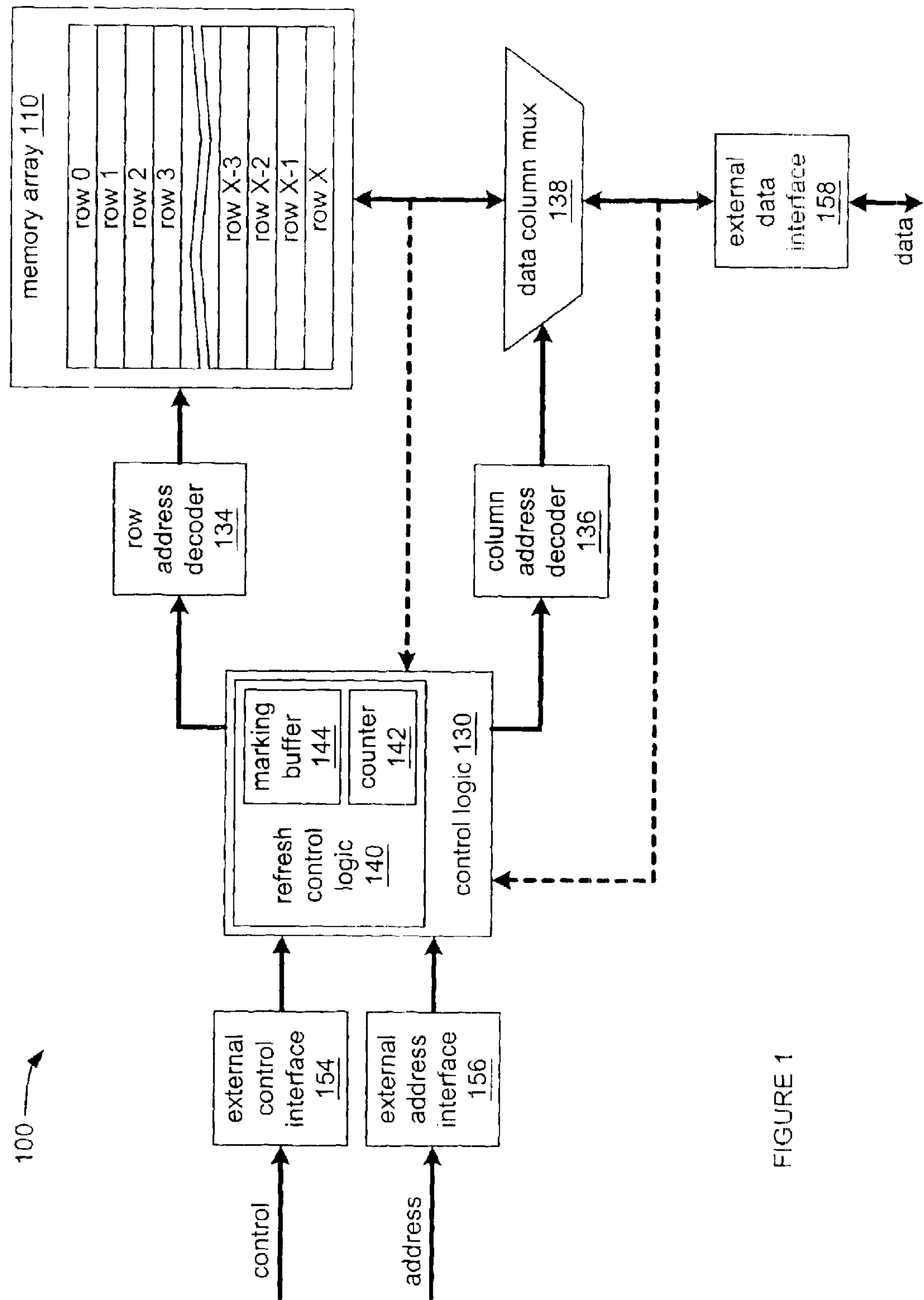
FIG. 1 is a block diagram of an embodiment employing a memory device.

FIG. 1 is a simplified block diagram of one embodiment employing a memory device. Memory device 100 is, at least in part, made up of memory array 110, control logic 130, row address decoder 134, column address decoder 136, data column multiplexer 138, external control interface 154, external address interface 156, and external data interface 158. Those skilled in the art of the design of memory devices, including DRAM devices, will readily recognize that FIG. 1 provides a relatively simple depiction of components making up a DRAM device, and that the exact arrangement and configuration of components within a DRAM device may be reduced, augmented or otherwise altered without departing from the spirit and scope of the present invention as hereinafter claimed. Specifically, although memory device 100 is depicted as having only one memory array 110, suggesting that memory device 100 has only one "bank" of memory cells organized in a single two dimensional array for the sake of simplicity of discussion, it will be understood by those skilled in the art that the memory cells of memory device 100 may be organized in any of a number of ways, including having more than one memory array to provide more than one bank, or having a single memory array configured to provide the functional equivalent of multiple banks.

External control interface 154, external address interface 156 and external data interface 158, together, provide an interface between memory device 100 and external devices (not shown) that are attached to memory device 100. Through external control interface 154, which is coupled to control logic 130, memory device 100 receives commands to carry out read, write and other operations. Through external address interface 156, which is coupled to control logic 130, memory device 100 receives addresses specifying which memory cell(s) within memory array 110 are involved in read, write and other operations. Through external data interface 158, which is coupled to at least data column multiplexer 138, memory device 100 both transmits data retrieved from memory array 10 to external devices and receives data sent by external devices to be stored in memory array 110.

Control logic 130 coordinates the carrying out of commands received via external control interface 154, either with or without addresses and/or other information received via external address interface 156. The memory cells of memory array 110 are organized into a two dimensional array of rows and columns, such that control logic 130 selects portions of memory array 10 to be accessed to carry out a read, write or other operation by sending row addresses to row address decoder 134 and column addresses to column address decoder 136, both of which are coupled to control logic 130. Row address decoder 134 decodes the row address received from control logic 130 and uses the decoded row address to select a row of memory cells within memory array 110 for access. Similarly, column address decoder 136 decodes the column address received from control logic 130 and uses the decoded column address to control data column multiplexer 138 (to which column address decoder 136 is coupled) to select memory cell(s) from the row of memory cells selected by row address decoder 134 for access.

Making up part of control logic 130 is refresh control logic 140 which selectively carries out refresh operations to refresh rows of memory cells within memory array 110 that are marked as having data to be preserved in response to requests to carry out refresh operations. Whether a refresh operation is requested as a result of receiving a command from an external device or in response to the passage of a predetermined interval of time triggering an internal request, refresh control logic 140 first determines if a row requested to be refreshed is marked as having data to be preserved. If a row requested to be refreshed is not marked as having data to be preserved, refresh logic 140 does not carry out the refresh operation on that row (in essence, refresh logic 140 "ignores" the request), thereby avoiding unnecessarily using power to refresh a row that does not have data that is to be preserved. Otherwise, if a row requested to be refreshed is marked as having data to be preserved, then refresh control logic 140 uses row address decoder 134 to select the row of memory cells, requested to be refreshed in a manner not unlike how a row of memory cells is selected to be accessed as part of a read or write operation. The selection and marking of rows as either having data to be preserved, or not, is carried out by an external device (not shown) to which memory device 100 is coupled, and from which memory device 100 receives commands causing one or more rows to be marked as either having data to be preserved or not.

When memory device 100 operates in a non-reduced power mode, refresh control logic 140 selectively carries out commands received via external control interface 154 from an external device to refresh one or more rows of memory cells within memory array 110. In an embodiment where a command received via external control interface 154 to carry out a refresh operation is accompanied by an indication through external control interface 154 and/or external address interface 156 of a specific row to be refreshed within memory array 110, the row address of the specified row is provided to row address decoder 134 to select the specified row for refreshing if the row is marked as having data to be preserved. In another embodiment where a command received via external control interface 154 to carry out a refresh is not accompanied by an indication of a particular row to be refreshed, counter 142 within refresh control logic 140 provides a row address for a row to be refreshed, and this row address from counter 142 is provided to row address decoder 134 to select a row for refreshing if that row is marked as having data to be preserved. Regardless of whether or not that row was marked as having data to be preserved, counter 142 is then incremented so as to provide another row address for use in response to a subsequent occurrence of such a refresh command in which no row is specified.

While memory device 100 operates in a reduced power mode, such as "self-refresh" mode, refresh control logic 140 selectively carries out the refreshing of rows of memory cells, autonomously, without prompting via commands received from an external device. In such a reduced power mode, counter 142 within refresh control logic 140 provides a row address for a row to be refreshed, and this row address is provided to row address decoder 134 to select a row for refreshing if that row is marked as having data to be preserved. Regardless of whether a row is marked as having data to be preserved, or not, counter 142 is incremented to provide another row address for use in a subsequent refresh operation.

In some embodiments, marking buffer 144 makes up part of refresh control logic 140 and maintains marking data concerning which rows of memory cells within memory array 110 are marked as having data to be preserved and which rows are not, and refresh control logic 140 accesses marking buffer 144 to determine if a refresh operation should be performed on a given row, or not. In some variations of such embodiments, an external device coupled to memory device 100 transmits a command to mark one or more rows of memory device 100, using a combination of control lines coupled to external control interface 154 and address lines coupled to external address interface 156 to select marking buffer 144 to be written to with marking data that marks one or more of the rows within memory array 110 as having data to be preserved, or not. It may be that marking data is provided to memory device 100 using available control and/or address lines coupled to external control interface 154 and/or external address interface 156, or alternatively, it may be that marking data is provided to memory device using data lines coupled to external data interface 158.

In other embodiments, one or more rows of memory cells within memory array 110 are allocated to maintain marking data indicating which rows are marked as having data to be preserved and which rows are not. In some variations of such embodiments, an external device coupled to memory device 100 transmits a write command to write at least a portion of a row in which marking data is kept with marking data indicating that one or more rows has data to be preserved, or not. Such a write command may follow a protocol and have timings similar to those employed in write commands for the normal writing of data to other memory cells within memory device 100 that are not used to store marking data. Alternatively, in other variations, an external device coupled to memory device 100 transmits a command to mark one or more rows of memory device 100, using a combination of control lines coupled to external control interface 154 and address lines coupled to external address interface 156 to select a row and/or column(s) within a row to be written with marking data that marks one or more rows as having data to be preserved, or not. Such a command may be configured with a protocol and/or timings differing from those of a normal write command in an effort reduce complexity and/or the amount of time required to transmit the command to memory device 100, perhaps by avoiding the use of data lines coupled to external data interface 158.

In embodiments using one or more rows of memory cells within memory array 110 to store marking data, it may be deemed desirable for refresh control logic 140 to at be at least partially made up of marking buffer 144 to serve as a type of cache for marking data read from one or more of the rows used to store marking data. It may be that accessing a row to obtain marking data as a prelude to every possible refresh operation to determine whether or not a refresh operation should actually be carried is deemed to take too long and/or deemed to use too much power. Therefore, a row storing marking data may be accessed to read at least a portion of the marking data within that row and store a copy in marking buffer 144. To accommodate such use of marking buffer 144, it may be desirable for marking buffer 144 to be coupled more directly to memory array 110 than external data interface 158 (which is coupled to memory array 110 through data column multiplexer 138) so that more of the columns of data from a selected row having marking data are made available to marking buffer 144 to store a copy of marking data than might be possible were marking buffer 144 coupled to memory array 110 through data column multiplexer 138. Alternatively, it may be deemed undesirable to provide marking buffer 144 within refresh control logic 140 as a result of concerns over the amount of power required to maintain a copy of marking data within marking buffer 144. Indeed, it may actually prove to be more desirable to obtain marking from a row within memory array 110 as a prelude to every possible refresh operation, and in such cases, marking buffer 144 may, indeed, be coupled to memory array 110 through data column multiplexer 138.

Figure 2:
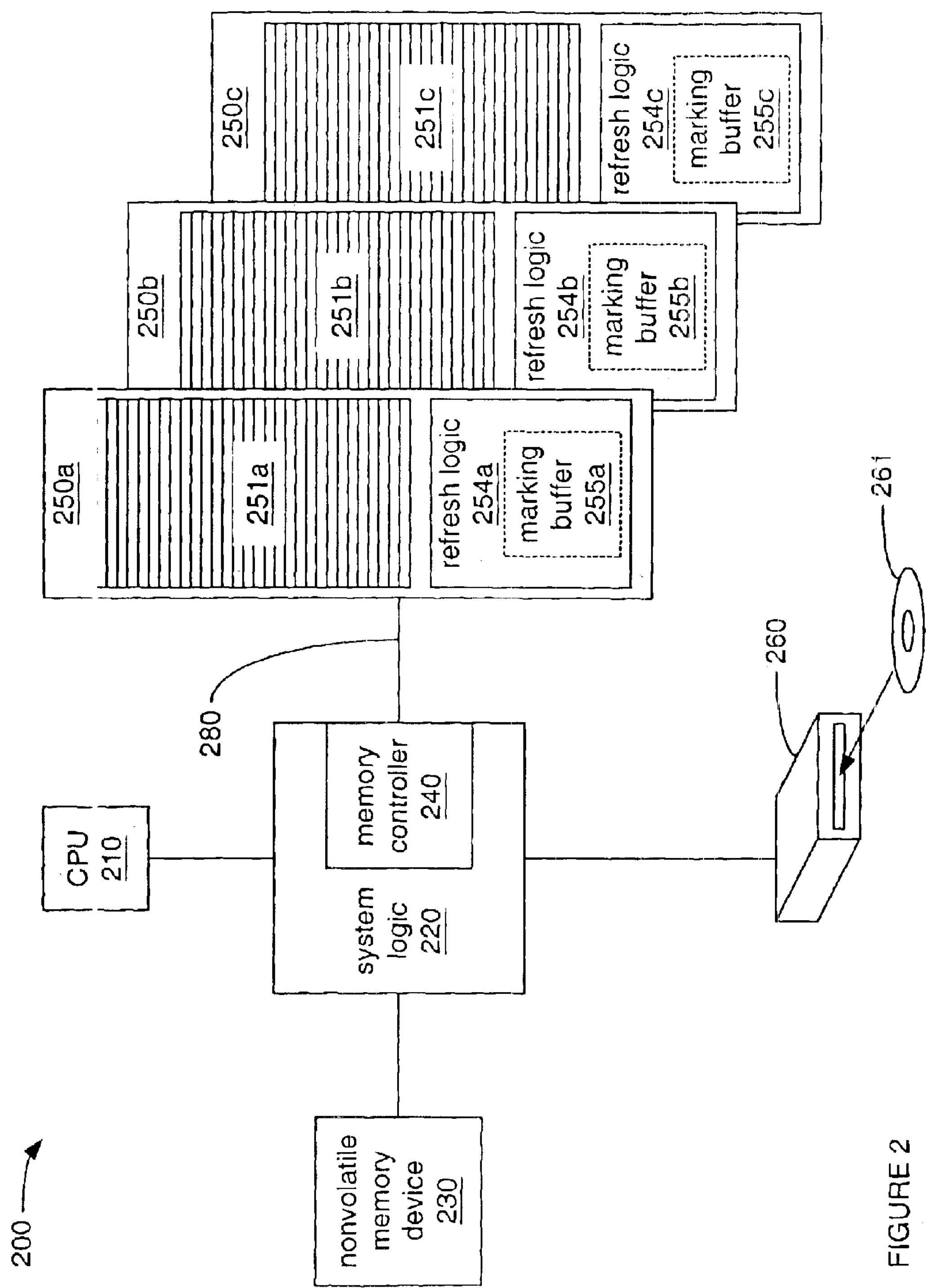
FIG. 2 is a block diagram of an embodiment employing a computer system.

FIG. 2 is a block diagram of one embodiment employing a computer system. Computer system 200 is, at least in part, made up of CPU (central processing unit) 210, system logic 220, and memory devices 250*a*–250*c*. System logic 220 is coupled to CPU 210 and performs various functions in support of the execution of instructions by CPU 210 including providing CPU 210 with access to memory devices 250*a*–250*c* to which system logic 220 is also coupled through memory controller 240 within system logic 220. CPU 210, system logic 220 and memory devices 250*a*–250*c* make up a form of core for computer system 200 capable of supporting the execution of machine readable instructions by CPU 210 and the storage of data, including instructions, within memory devices 250*a*–250*c*.

In various embodiments, CPU 210 could be any of a variety of types of CPU including a CPU capable of executing at least a portion of the widely known and used "×86" instruction set, and in other various embodiments, there could be more than one CPU. In various embodiments, memory devices 250*a*–250*c* could be any of a variety of types of DRAM including fast page mode (FPM), extended data out (EDO), single data rate (SDR) or double data rate (DDR) forms of synchronous dynamic RAM (SDRAM), RAM of various technologies employing a RAMBUS™ interface, etc. Memory controller 240 provides logic 220 with an appropriate interface for memory device 250*a*–250*c*, whatever the DRAM type. Despite the wide variety of possible types of DRAM, at least a portion of the memory cells of memory devices 250*a*–250*c* are organized in rows and columns in two dimensional memory arrays, such as memory arrays 251*a*–251*c*. To access a memory cell in any of memory arrays 251*a*–251*c*, at least a row address to select a row of memory cells from among multiple rows making up an array, and a column address to select a subset of the memory cells of the selected row for access must be specified. As those skilled in the art will recognize, the depiction of a triplet of memory devices in FIG. 2, namely memory devices 250*a*–250*c*, is but an example of a memory system that could accompany a CPU, and that a larger or smaller number of memory devices could be used without departing from the spirit and scope of the present invention as hereinafter claimed.

In some embodiments, system logic 220 is coupled to and provides CPU 210 with access to storage device 260 by which data and/or instructions carried by storage media 261 may be accessed. Indeed, in some embodiments, storage media 261 carries machine-accessible instructions to be executed by CPU 210 to cause CPU 210 to mark one or more rows within memory devices 250*a*–250*c* as either containing data to be preserved, or not, as will be described. Storage media 261 may of any of a wide variety of types based on any of a wide variety of technologies as those skilled in the art will understand, including CD or DVD ROM, magnetic or optical disk, magneto-optical disk, tape, semiconductor memory, characters or perforations on paper or other material, etc.

In some embodiments, nonvolatile memory device 230 is coupled to system logic 220 (or other part of computer system 200) and provides storage for an initial series of instructions executed at a time when computer system 200 is either "reset" or initialized (for example, when computer system 200 is "turned on" or "powered up") to perform tasks needed to prepare computer system 200 for normal use. In some variations of such embodiments, upon initialization or resetting of computer system 200, CPU 210 accesses nonvolatile memory device 230 to retrieve instructions to be executed to prepare memory controller 240 for normal use in providing CPU 210 with access to memory devices 250*a*–250*c*. It may be that these same retrieved instructions are executed to prepare system logic 220 for normal use in providing access to storage device 260 and whatever form of storage media 261 may be used by storage device 260.

Regardless of the source of a sequence of instructions to be executed by CPU 210 at the time of initialization or reset of computer system 200, CPU 210 is caused to initialize memory devices 250*a*–250*c* for use, including configuring refresh logic 254*a*–254*c* and accompanying storage for marking data to mark row(s) of memory within at least one of memory devices 250*a*–250*c* as either having data to be preserved through the carrying out of refresh operations, or not. In one embodiment where refresh logic 254*a* of memory device 250*a* incorporates marking buffer 255*a* to store marking data specifying which rows of memory cells within memory array 251*a* contain data to be preserved, CPU 210 may be caused by the execution of a sequence of instructions to use memory controller 240 to transmit commands and/or data to memory device 250*a* to initialize entries within marking buffer 255*a* to a state where no rows within memory array 251*a* are marked as having data to be preserved. In another embodiment where refresh logic 254*a* incorporates marking buffer 255*a* as a cache for marking data obtained from one or more rows within memory array 251*a*, CPU 210 may be caused to cooperate with memory controller 240 to choose which row(s) of memory array 251*a* will be used to store marking data and/or may be caused to initialize memory cells of row(s) to be used to store marking data to a state where rows within memory array 251*a* are marked as not having data to be preserved. In still another embodiment where refresh logic 254*a* does not incorporate a marking buffer such as marking buffer 255*a*, CPU 210 may also be caused to choose rows for use in storing marking data and/or initializing memory cells in rows used to store marking data to a state where rows within memory array 251*a* are marked as not having data to be preserved.

During normal operation of computer system 200, CPU 210 executes instructions causing CPU 210 to write data (perhaps including instructions) into one or more rows making up a memory array within a memory device, such as memory array 251*a* of memory device 250*a*. Prior to or coincident with writing such data into a row within memory device 250*a*, CPU 210 is further caused to transmit a command through memory controller 240 to memory device 250*a* to mark the row into which such data is being written as having data to be preserved. In an embodiment where marking data is stored in a buffer separate from memory array 251*a*, such as marking buffer 255*a*, a portion of marking buffer 255*a* will be written to mark that row as having data to be preserved. In another embodiment where marking data is stored in row(s) within memory array 251*a*, a portion of a row in which marking data is stored will be written to mark the row into which data is being written as having data to be preserved. As a result, when refresh logic 254*a* is either commanded by memory controller 240 to refresh that row, specifically, or when a counter within refresh logic 254*a* provides a row address specifying that row at a time when a refresh operation is to be carried out, refresh logic 254*a* will obtain the marking data corresponding to that row, will determine that a refresh operation should actually be carried out so as to refresh that row, and will carry out a refresh operation on that row.

During normal operation of computer system 200, CPU 210 executes instructions causing CPU 210 to transmit a command through memory controller 240 to memory device 250*a* to mark a row as not having data to be preserved. In an embodiment where marking data is stored in a buffer separate from memory array 251*a*, such as marking buffer 255*a*, a portion of marking buffer 255*a* will be written with a value marking that row as not having data to be preserved. In another embodiment where marking data is stored in one or more rows within memory array 251*a*, a portion of a row in which marking data is stored will be written with a value marking that row as not having data to be preserved. As a result, when refresh logic 254*a* is either commanded by memory controller 240 to refresh that row, specifically, or when a counter within refresh logic 254*a* provides a row address specifying that row at a time when a refresh operation is to be carried out, refresh logic 254*a* will obtain the marking data corresponding to that row, will determine that a refresh operation should not be carried out to refresh that row, and will refrain from carrying out a refresh operation on that row.

In some embodiments, when computer system 200 is in a reduced power state, memory devices making up computer system 200, such as memory device 250*a*, receive a command from memory controller 240 to enter a reduced power state such as a self refresh state in which at least some of the interactions taking place between memory controller 240 and memory device 250*a* during normal operation of computer system 200 in a non-reduced power state cease. During such a self-refresh state, memory device 250*a* must autonomously carry out refresh operations to refresh rows of memory cells within memory array 251*a*, and requests to carry out a refresh operation to refresh a given row may be generated by a counter at a predetermined interval of time within refresh logic 254*a*, instead of being received from memory controller 240. In response to each request to carry out a refresh operation to refresh a row for which the counter has generated a row address, refresh logic 254*a* accesses marking data, whether within a specialized buffer such as marking buffer 255*a* or within rows allocated within memory array 251*a*, to determine if the row that has been requested to be refreshed is marked as having data to be preserved. If the row for which a request has been made to carry out a refresh operation is marked as having data to be preserved, then the refresh operation is carried out, thereby helping to ensure that the contents of that row are not lost. Otherwise, if the row for which such a request has been made is not marked as having data to be preserved, then the refresh operation is not carried out.

Figure 3:
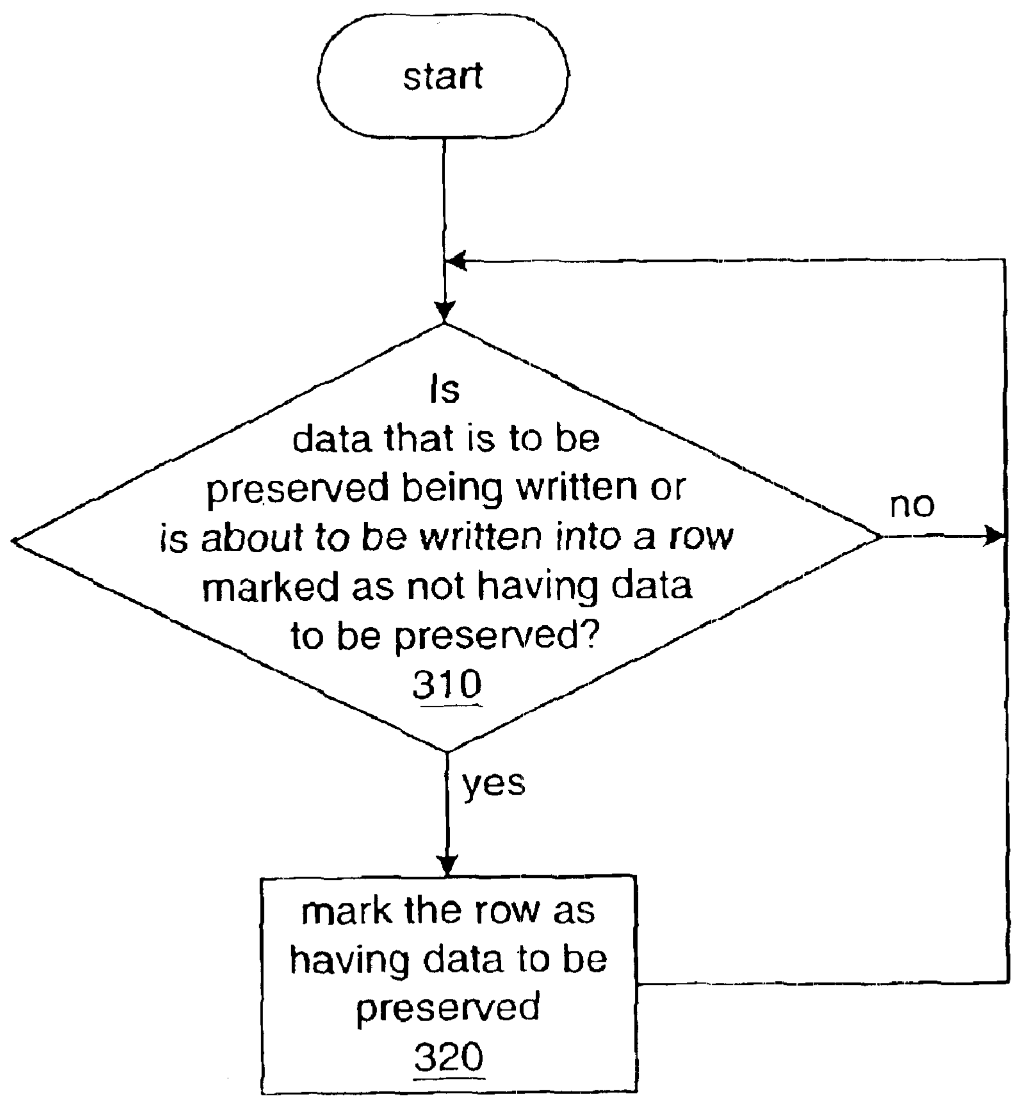
FIG. 3 is a flow chart of a method of an embodiment.

FIG. 3 is a flow chart of embodiments. As data that is to be preserved is being written to a row of memory cells in a memory device, or as data that is to be preserved is about to be written to a row of memory cells at 310, that row is marked as having data to be preserved at 320 if that row is not already so marked. In one embodiment, a CPU executes a series instructions making up a portion of monitoring software that at least monitors accesses made to a memory device by the CPU as the CPU executes another series of instructions, and the monitoring software causes the CPU to mark one or more of those rows of as having data to be preserved.

Figure 4:
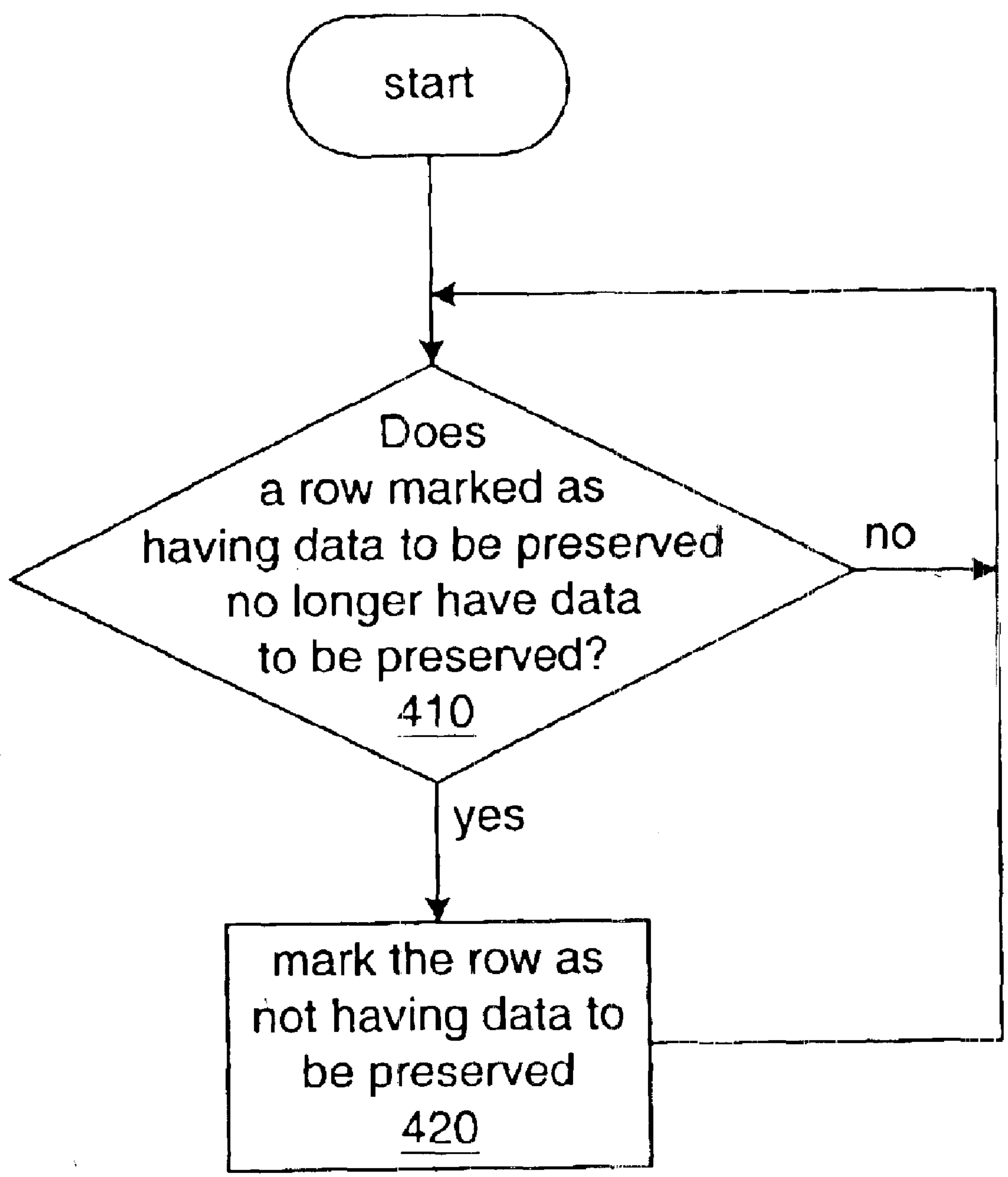
FIG. 4 is a flow chart of a method of another embodiment.

FIG. 4 is another flow chart of embodiments. During the normal operation of an electronic device, as a row marked as having data to be preserved ceases to have data that actually is to be preserved at 410, that row is marked as not having data to be preserved at 420. In one embodiment, a CPU executes a series instructions making up a portion of monitoring software that at least monitors the deallocation of locations of blocks of memory by another series of instructions being executed by the CPU, and the monitoring software causes the CPU to mark one or more of rows of as not having data to be preserved as the deallocation of locations of blocks of memory result in one or more rows no longer actually having data to be preserved.

Figure 5:
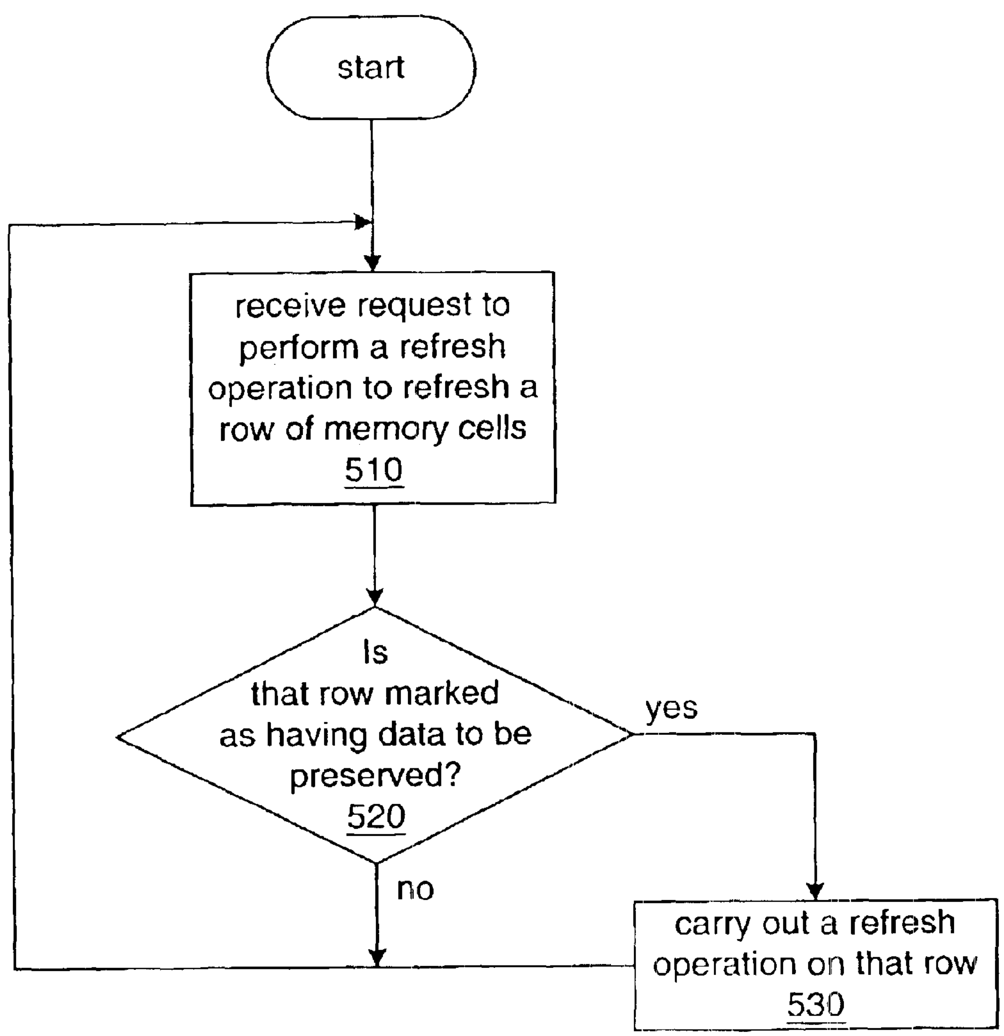
FIG. 5 is a flow chart of a method of still another embodiment.

FIG. 5 is still another flow chart of embodiments. At 510, a request to refresh a row of memory cells within memory device is received. In some embodiments, this request is made by a device external to a memory device, and in other embodiments, this request is generated by a counter within a memory device providing row addresses of rows to refreshed at regular intervals, such as when a memory device is in a reduced power mode (such as a "self refresh" mode) At 520, a check is made as to whether or not that row is marked as having data to be preserved. If the row is marked as having data to be preserved, then the a refresh operation is carried out on that row at 530.

Figure 6A:
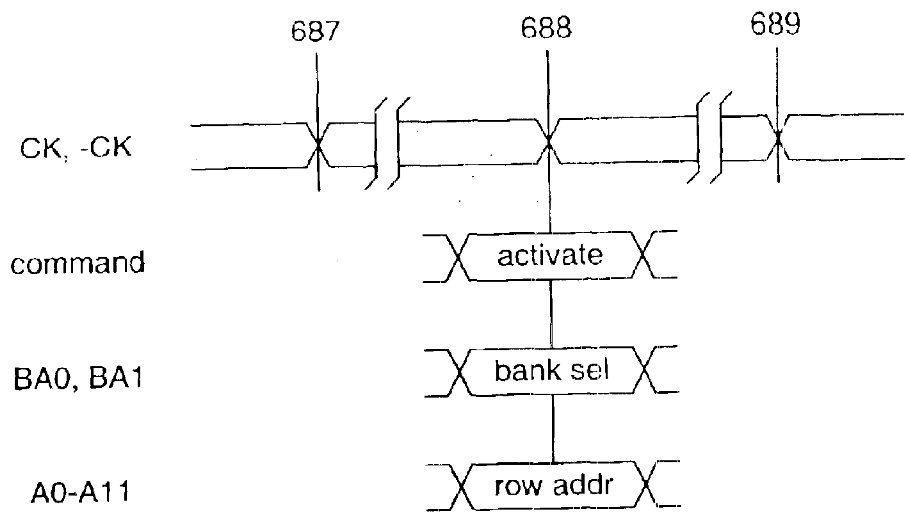
FIGS. 6*a* and 6*b* are timing diagrams of embodiments employing a memory bus.
Figure 6B:
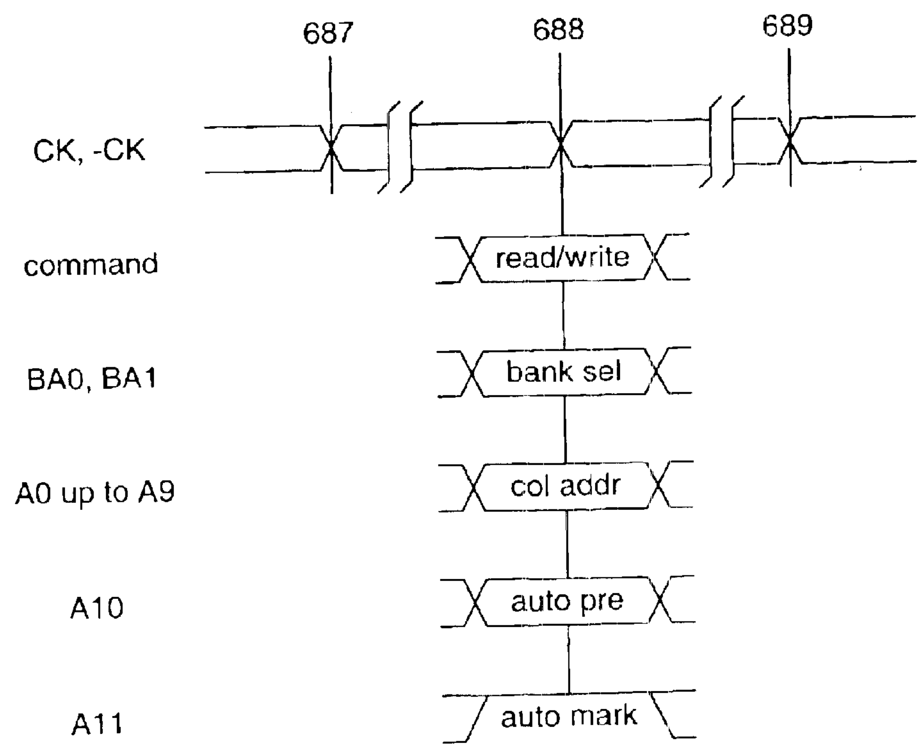

FIGS. 6*a* and 6*b* are timing diagrams of embodiments employing the transmission of signals across a memory bus. Both FIGS. 6*a* and 6*b* depict the transmission of a marking command to one or more memory devices to mark a row of memory cells as either having data to be preserved, or not. Although these figures and the accompanying discussion center on embodiments of memory buses on which transactions take place that are synchronized to a clock signal, it will be readily understood by those skilled in the art that other embodiments may employ other forms of timing coordination or may be asynchronous.

Referring to FIG. 6*a*, in one embodiment configured to have timings compatible with one or more known SDRAM interfaces, a marking command is embedded within an activate command, creating a combined command to one or more memory devices to both activate a specific row for access, and mark that row as either having data to be preserved, or not. Although FIG. 6*a* and this accompanying discussion focus on embedding a marking command within an activate command, other embodiments may entail embedding a marking command within one or more other possible commands. In some variations of such an embodiment, an additional command signal line may be added to a preexisting set of command signal lines normally used with known SDRAM interfaces. Such an additional signal line may simply be used to double the number of different commands that can be binary encoded on the now increased set of command signal lines. Alternatively, such an additional signal line may solely serve the purpose of adding marking commands as embedded commands to any of a number of possible preexisting commands.

The actual transmission of the activate command with embedded marking command may be preceded by a predetermined number of clock transitions on the CK and −CK signal lines between time points 687 and 688 in which no transmission of commands, addresses or data takes place, if needed, depending on the timing requirements of a given SDRAM interface and/or memory device in which the row to be marked is located. The activate command and embedded marking command are transmitted at time point 688, and coincident with the transmission of these commands in one variation of such an embodiment, bank address signals BA0 and BA1 transmit the bank address of the bank in which the affected row is located (if the given memory device(s) have multiple banks), and address signals A0–A11 are used to specify the affected row within that bank. Another predetermined number of clock transitions of the CK and −CK signal lines between time points 288 and 289 in which, again, no activity occurs may follow the transmission of the precharge command, if needed.

Referring to FIG. 6*b*, in another embodiment similar to that depicted in FIG. 6*a*, and also configured to have timings compatible with one or more known synchronous DRAM interfaces, a marking command is embedded within a data access command, such as a read or write command, creating a combined command to one or more memory devices to both read or write data, and mark the row involved in the data access as either having data to be preserved, or not. Although FIG. 6*b* and this accompanying discussion focus on embedding a marking command within a data access command, other embodiments may entail embedding a marking command within one or more other possible commands.

The actual transmission of a data access command with embedded marking command may again be preceded and/or followed by predetermined numbers of clock transitions on the CK and −CK signal lines between time points 687 and 688, and/or time points 688 and 689, respectively, in which no transmission of commands, addresses or data takes place, if needed, depending on the timing requirements of a given SDRAM interface and/or memory device in which the row to be accessed and marked is located. The data access (read or write) command is transmitted at time point 688, and coincident with the transmission of this command in one variation of such an embodiment, bank address signals BA0 and BA1 transmit the bank address of the bank in which the affected row is located (if the given memory device(s) have multiple banks), and address signals A0 up to A9 (depending on the number of available columns) are used to specify the column(s) within the affected row within that bank to be accessed.

Also coincident with the transmission of the data access command is the transmission of a high state on address signal A11, thereby indicating that a marking command to mark the affected row either as having data to be preserved, or not, is embedded within the data access command. In some variations of such an embodiment, there may be provided a way of indicating whether the embedded marking command is meant to mark the affected row as having data to be preserved, or not. Alternatively, in other variations of such an embodiment, such a use of address signal A11 may be made as part of a protocol in which embedding a marking command with a write command is to be interpreted as a command to mark the affected row as having data to be preserved, while embedding a marking command with a read command is to be interpreted as a command to mark the affected row as not having data to be preserved. Further coincident with the transmission of the data access command may be the transmission of a high state on address signal A10, thereby indicating that an auto precharge command to close the row after the data access has been carried out may have been embedded within the data access command, as well.

In the embodiments depicted in FIGS. 6*a* and 6*b*, the choices of which command and/or address signal lines may be used to transmit a marking command were made to promote interoperability with known synchronous DRAM interfaces, including, but not limited to, the currently widely used DDR variants of synchronous DRAM interfaces. Despite references to the use of a specific signal line, such as address line A11, those skilled in the art will readily recognize that any combination of command and/or address signal lines may be employed for the purpose of transmitting a marking command and/or providing interoperability with existing DDR variants without departing from the spirit and scope of the present invention as hereinafter claimed.

Figure 7:
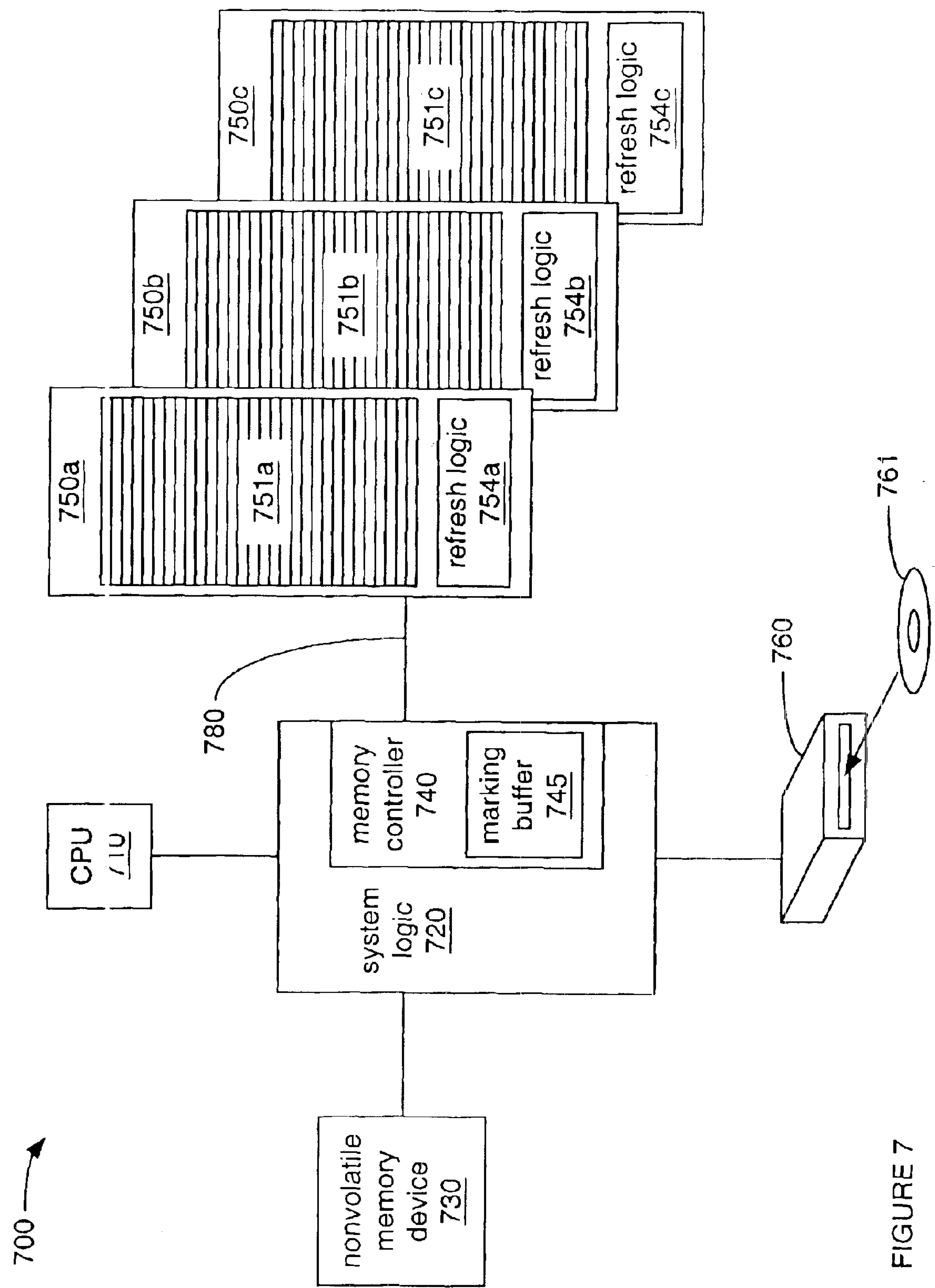
FIG. 7 is a block diagram of another embodiment employing a computer system.

FIG. 7 is a block diagram of another embodiment employing a computer system. Not unlike computer system 200 of FIG. 2, computer system 700 is, at least in part, made up of CPU 710, system logic 720, and memory devices 750*a*–750*c*. System logic 720 is coupled to CPU 710 and performs various functions in support of the execution of instructions by CPU 710 including providing CPU 710 with access to memory devices 750*a*–750*c* to which system logic 720 is also coupled through memory controller 740 within system logic 720 and memory bus 780. CPU 710, system logic 720 and memory devices 750*a*–750*c* make up a form of core for computer system 700 capable of supporting the execution of machine readable instructions by CPU 710 and the storage of data, including instructions, within memory devices 750*a*–750*c*.

As was the case with computer system 200, in various embodiments of computer system 700, CPU 710 could be any of a variety of types of CPU, memory devices 750*a*–750*c* could be any of a variety of types of DRAM and memory controller 740 provides logic 720 with an appropriate interface for memory device 750*a*–750*c* through memory bus 780, whatever the DRAM type. As those skilled in the art will recognize, the depiction of a triplet of memory devices in FIG. 7, namely memory devices 750*a*–750*c*, is but an example of a memory system that could accompany a CPU, and that a larger or smaller number of memory devices could be used without departing from the spirit and scope of the present invention as hereinafter claimed.

In some embodiments, system logic 720 is coupled to and provides CPU 710 with access to storage device 760 by which data and/or instructions carried by storage media 761 may be accessed, and when executed by CPU 710, may cause CPU 710 to mark one or more rows within memory devices 750*a*–750*c* as either containing data to be preserved, or not, as will be described. Storage media 261 may of any of a wide variety of types based on any of a wide variety of technologies as those skilled in the art will understand. In some embodiments, nonvolatile memory device 730 is coupled to system logic 720 (or other part of computer system 700) and provides storage for an initial series of instructions executed at a time when computer system 700 is either reset or initialized to perform tasks needed to prepare computer system 700 for normal use, which may entail preparing memory controller 740 for normal use in providing CPU 710 with access to memory devices 750*a*–750*c*, and/or preparing system logic 720 for normal use in providing access to storage device 760 and whatever form of storage media 761 may be used by storage device 760.

Regardless of the source of a sequence of instructions to be executed by CPU 710 at the time of initialization or reset of computer system 700, CPU 710 is caused to initialize memory devices 750*a*–750*c* for use, including configuring memory controller 740 and marking buffer 745 within memory controller 740 to mark row(s) of memory within at least one of memory devices 750*a*–750*c* as either having data to be preserved through the carrying out of refresh operations, or not. CPU 710 may be caused by the execution of a sequence of instructions to initialize entries within marking buffer 745 to a state where no rows within one or more of memory arrays 751*a*–751*c* are marked as having data to be preserved.

During normal operation of computer system 700, CPU 710 executes instructions causing CPU 710 to write data (perhaps including instructions) into one or more rows making up a memory array within a memory device, such as memory array 751*a* of memory device 750*a*. Prior to or coincident with writing such data into a row within memory device 750*a*, CPU 710 is further caused to write marking data into marking buffer 745 to mark the row within memory array 751*a* into which such data is being written as having data to be preserved. As a result, when memory controller 740 is to command that a row within memory array 751*a* be refreshed, memory controller 740 will obtain marking data from marking buffer 745 to identify a row marked as having data to be preserved, perhaps the very same row that CPU

710 was just caused to mark as having data to be preserved. Memory controller 740 will then transmit a row address identifying that row with the refresh command to memory device 750*a*, causing memory device 750*a* to carry out a refresh operation on that specific row within memory array 751*a*.

In some embodiments, when computer system 700 is in a reduced power state, memory devices making up computer system 700, such as memory device 750*a*, receive a command from memory controller 740 to enter a reduced power state such as a self refresh state. During such a self-refresh state, memory device 750*a* must autonomously carry out refresh operations to refresh rows of memory cells within memory array 751*a*, and requests to carry out a refresh operation to refresh a given row may be generated by a counter at a predetermined interval of time within refresh logic 754*a*, instead of being received from memory controller 740. Since, unlike memory device 250*a* of FIG. 2, refresh logic 754*a* of memory device 750*a* does not have a marking buffer, memory device 750*a* may refresh all rows within memory array 751*a*, regardless of which rows within memory array 751*a* are marked in marking buffer 745 as having data to be preserved, and which rows are not. This may be necessitated by the need to conserve power by ceasing at least some forms of interaction between memory controller 740 and memory device 750*a*, as is normally done as part of entering a self-refresh state, as would be known to those skilled in the art.

The invention has been described in conjunction with the preferred embodiment. It is evident that numerous alternatives, modifications, variations and uses will be apparent to those skilled in the art in light of the foregoing description. It will be understood by those skilled in the art that the present invention may be practiced in support of various types of electronic devices with various possible memory devices in which the memory cells repeatedly require some form of "refreshing" or other regular maintenance activity in order to prevent the loss of data. It will also be understood by those skilled in the art that the present invention may be practiced in support of electronic devices other than computer systems such as audio/video entertainment devices, controller devices in vehicles, appliances controlled by electronic circuitry, etc.

What is claimed is:

1. An apparatus comprising:

a memory array having a plurality of memory cells organized into a plurality of rows of multiple memory cells;

a marking buffer storing an indication of which rows of memory cells within the memory array are marked as having data to be preserved; and a refresh logic to selectively refresh a row of memory cells if the row is marked in the marking buffer as having data to be preserved.

2. The apparatus of claim 1, further comprising an interface to receive a command to carry out a refresh operation on a row of memory cells.

3. The apparatus of claim 2, wherein the interface is configured to receive a value accompanying the command to carry out a refresh operation identifying a specific row of memory cells on which to selectively carry out the commanded refresh operation.

4. The apparatus of claim 2, wherein the refresh logic further comprises a counter to provide a value identifying a specific row of memory cells on which to selectively carry out the commanded refresh operation in response to receiving the command to carry out a refresh operation on a row of memory cells.

5. The apparatus of claim 1, further comprising:

an interface to receive a command to enter a reduced power state in which commands to carry out a refresh operation are not accepted from an external device; and a counter to provide a value identifying a specific row of memory cells on which to selectively carry out a refresh operation in response to the passage of a predetermined interval of time.

6. The apparatus of claim 1, wherein the marking buffer is comprised of one or more rows of memory cells comprising the memory array.

7. An apparatus comprising:

a CPU;

a memory device having a plurality memory cells organized into a plurality of rows of multiple memory cells, and having an interface to receive a command to mark a row of memory cells as not having data to be preserved; and a memory controller coupled to both the CPU and the memory device, and configured to transmit a command to the memory device to mark a row of memory cells as not having data to be preserved.

8. The apparatus of claim 7, wherein the memory device further comprises a refresh logic that is configured to refrain from refreshing a row of memory cells marked as not having data to be preserved despite a request to refresh that row of memory cells.

9. The apparatus of claim 8, wherein the memory device receives the request from the memory controller to refresh a specific row of memory cells.

10. The apparatus of claim 8, wherein the refresh logic is comprised of a counter to provide an address of a row of memory cells to generate a request to refresh that row of memory cells.

11. The apparatus of claim 7, wherein the memory controller is further configured to transmit a command to the memory device to mark a row of memory cells as having data to be preserved and the interface of the memory device is configured to receive the command to mark a row of memory cells as having data to be preserved.

* * * * *

UNITED STATES PATENT AND TRADEMARK OFFICE

CERTIFICATE OF CORRECTION

PATENT NO. : 6,876,593 B2
DATED : April 5, 2005
INVENTOR(S) : Shi et al.

It is certified that error appears in the above-identified patent and that said Letters Patent is hereby corrected as shown below:

Column 2,
Line 67, delete "10" and insert -- 110 --.

Column 11,
Line 7, insert -- During normal operation of computer system 700, CPU 710 executes instructions causing CPU 710 to write marking data into marking buffer 745 to mark a row within a memory array, such as memory array 751a of memory device 750a, as not having data to be preserved. As a result, when memory controller 740 is to command that a row within memory array 751a be refreshed, memory controller 740 will obtain marking data from marking buffer 745 to identify a row marked as having data to be preserved, and the identified row will be a row other than the one that CPU 710 was just caused to mark as not having data to be preserved. Memory controller 740 will then transmit a row address identifying that other row with the refresh command to memory device 750a, causing memory device 750a to carry out a refresh operation on that specific row within memory array 751a. --.

Signed and Sealed this

Twenty-third Day of August, 2005

JON W. DUDAS
*Director of the United States Patent and Trademark Office*